United States Patent [19]
DiStefano et al.

[11] Patent Number: 5,821,608
[45] Date of Patent: Oct. 13, 1998

[54] LATERALLY SITUATED STRESS/STRAIN RELIEVING LEAD FOR A SEMICONDUCTOR CHIP PACKAGE

[75] Inventors: Thomas H. DiStefano, Monte Sereno; Joseph Fjelstad, Sunnyvale; John W. Smith, Palo Alto, all of Calif.

[73] Assignee: Tessera, Inc., San Jose, Calif.

[21] Appl. No.: 709,127

[22] Filed: Sep. 6, 1996

Related U.S. Application Data

[60] Provisional application No. 60/003,424, Sep. 8, 1995.

[51] Int. Cl.$^6$ .................. H01L 23/495; H01L 23/48; H01L 23/52; H01L 23/02
[52] U.S. Cl. .................. 257/669; 257/786; 257/692; 257/773
[58] Field of Search .................. 257/669, 697, 257/698, 700, 708, 737, 738, 787, 777, 783, 786, 774, 780, 773, 784, 781, 692; 361/714, 722

[56] References Cited

U.S. PATENT DOCUMENTS

| | | | |
|---|---|---|---|
| 4,642,889 | 2/1987 | Grabbe | 29/840 |
| 5,148,265 | 9/1992 | Khandros et al. | 257/773 |
| 5,148,266 | 9/1992 | Khandros et al. | 257/773 |
| 5,316,788 | 5/1994 | Dibble et al. | 427/98 |
| 5,489,749 | 2/1996 | DiStefano et al. | 361/760 |
| 5,536,909 | 7/1996 | DiStefano et al. | 174/261 |
| 5,581,122 | 12/1996 | Chao et al. | 257/738 |
| 5,640,048 | 6/1997 | Selna | 257/738 |
| 5,646,828 | 7/1997 | Degani et al. | 257/738 |
| 5,663,593 | 9/1997 | Mostafazadeh et al. | 257/778 |

*Primary Examiner*—Mahshid D. Saadat
*Assistant Examiner*—Jhihan B. Clark
*Attorney, Agent, or Firm*—Lerner, David, Littenberg, Krumholz & Mentlik, LLP

[57] ABSTRACT

A semiconductor chip package includes a substrate having a first surface and a second surface and a gap extending from the first surface to the second surface. The substrate defines a plane which is substantially parallel to the first and second surfaces. The substrate has conductive terminals accessible and the second surface and bond pads. Conductive leads extend across the gap whereby each lead electrically interconnects one of the conductive terminals and one of the bond pads. Each lead includes an expansion section within the gap which is laterally curved with respect to the plane. A semiconductor chip having a back surface and a face surface is assembled to the substrate. The face surface includes a plurality of contacts on the periphery of the face surface of the chip whereby the chip contracts are electrically connected to the bond pads on the substrate.

39 Claims, 6 Drawing Sheets

LATERALLY SITUATED STRESS/STRAIN RELIEVING LEAD FOR A SEMICONDUCTOR CHIP PACKAGE

CROSS REFERENCE TO RELATED APPLICATIONS

The present application claims benefit of U.S. Provisional application Ser. No. 60/003,424 filed Sep. 8, 1995.

FIELD OF THE INVENTION

The present invention relates generally to interconnecting semiconductor chips and supporting substrates, and more particularly relates to a structure for compliantly interconnecting semiconductor chips and supporting substrates while substantially obviating the problems encountered due to their differences in the thermal coefficients of expansion.

BACKGROUND OF THE INVENTION

Semiconductor chips typically are connected to external circuitry through contacts on a surface of the chip. To save area on a supporting substrate, such as a printed circuit board, these chips are typically directly connected/soldered to the substrates and from there connected to external circuitry on other parts of the substrate. The contacts on the chip are generally either disposed in regular grid-like patterns, substantially covering the front surface of the chip (commonly referred to as an "area array") or in elongated rows extending parallel to and adjacent each edge of the chip front surface.

The body of the chip package may be comprised of a molded plastic or ceramic material. Many of the techniques for solder attachment run into problems because of the thermal expansion mismatch between the material the package is composed of and the material the supporting substrate is made of, such as a printed wiring board ("PWB"). In other words, when heat is applied to the chip/substrate combination, they both expand; and when the heat is removed, the device and the substrate both contract. The problem that arises is that the device and the substrate expand and contract at different rates and at different times, thereby stressing the interconnections between them.

In attempting to use the area on printed circuit boards more efficiently, IC manufacturers have recently been switching from larger, more cumbersome interconnection conventions, such as pin grid arrays ("PGAs") and the perimeter leaded quad flat packs ("QFPs"), to smaller conventions, such as ball grid arrays ("BGAs"). Using BGA technology, semiconductor chips are typically interconnected with their supporting substrates using solder connections. However, when solder alone is used to interconnect the package's contacts to the substrate, the columns or balls of solder are generally designed to be short to maintain the solder's structural integrity. This results in minimal elastic solder connection properties which further results in increased susceptibility to solder cracking due to fatigue brought on by the thermal cycling (heating and cooling cycles of the device/substrate).

An interconnection solution put forth in U.S. Pat. No. 4,642,889, entitled "Compliant Interconnection and Method Therefor" issued Apr. 29, 1985 to Grabbe seeks to alleviate the aforementioned solder cracking problem by embedding wires within each solder column to reinforce the solder thereby allowing higher solder pedestals and more elasticity. Another solution includes spirally wrapping wire around the outside of the solder. A further solution put forth includes providing a combination of solder and high lead solder, as found in U.S. Pat. No. 5,316,788, entitled "Applying Solder to High Density Substrates" issued to Dibble et al. All of these prior art solutions are aimed at increasing the compliancy of the interconnections in order to reduce the shear stress endured by the interconnections because of the thermal cycling. However, as packages are reduced in size, the number of devices packed into a given area will be greater. The heat dissipated by the each of these devices will have a greater effect on the surrounding devices and will thus increase the need for a highly compliant interconnection scheme for each device. Further, as the number of device interconnections increases, as is the case when chips are integrated into multichip modules, the overall rigidity of the total interconnection also increases thereby again increasing the need for a highly compliant interconnection scheme. None of the aforementioned prior solutions provides an interconnection scheme which is compliant enough to effectively deal with these problems.

Certain designs have reduced solder connection fatigue by redistributing the thermal cycling stress into a portion of the chip package itself. An example of such a design is shown in commonly assigned U.S. Pat. Nos. 5,148,265 and 5,148,266, the both disclosures of which are incorporated herein by reference. One disclosed embodiment of these patents shows the use of a chip carrier in combination with a compliant layer to reduce the coefficient of thermal expansion ("CTE") mismatch problems. Typically, the compliant layer includes an elastomeric layer which, in the finished package, is disposed between the chip carrier and the face surface of the chip. The compliant layer provides resiliency to the individual terminals, allowing each terminal to move in relation to its electrically connected chip contact to accommodate CTE mismatch as necessary during testing, final assembly and thermal cycling of the device.

Despite the positive results of the aforementioned commonly owned inventions, still further improvements would be desirable.

SUMMARY OF THE INVENTION

The present invention provides a semiconductor chip package having a means to help compensate for the CTE mismatch between the chip and the PWB.

In one embodiment, the package includes a sheet-like substrate having at least one gap extending from a first surface to a second surface of the substrate. The substrate has conductive terminals which may be contacted from the second surface side of the substrate. The substrate further has conductive leads electrically connected to and extending from each terminal and across the gap or gaps. Each lead is connected to a bond pad on the opposite side of the gap, wherein each lead has an expansion section within the gap which is laterally curved with respect to the plane of the substrate. Typically, the expansion sections laterally curve at least twice in opposite directions and in one embodiment create substantially "s" shaped lead portions. A semiconductor chip having a back surface and a face surface is connected to the substrate. The chip further has a plurality of chip contacts located on a periphery of the face surface. The chip contacts are electrically and mechanically connected to respective bond pads on the substrate. This structure allows the package to compensate for CTE mismatch problems by the flexing and bending of the expansion sections of the leads within the gap(s). The substrate may also be adhered to a chip surface, either rigidly or compliantly adhered as through the use of a compliant layer between the chip and the substrate. Such a compliant layer would aid in compensating for the CTE mismatch problems. Further, the expansion sections of the leads are typically encapsulated with a compliant encapsulant to provide added support for their bending and flexing motion during thermocycling.

In a "face-down" embodiment, the first surface of the substrate overlies the face surface of the chip. If it desired that the package dimensions be kept as small as possible, the terminals will lie in a central region of the substrate bounded by the chip contacts, in a so called "fan-in" structure. Each bond pad is thus aligned with and bonded to a respective chip contact. Typically, the gap in the substrate then extends between the bond pads and the terminals such that the gap encircles the central region of the substrate creating a first substrate bearing the terminals and a second substrate bearing the bond pads. However, more than one gap may be used if it is not desired to have the bond pad portion of the substrate be discrete from the terminals portion of the substrate.

In this "face-down" structure, it may also be desired for the terminals to outside of the periphery of the chip, in a so called "fan-out" structure. In this arrangement, the substrate may be continuous beneath the chip or may have an aperture so that the face surface of the chip may be accessed after the bond pads are connected to respective chip contacts. The gap, in this arrangement is placed between the bond pads and the terminals such that the expansion sections of the leads may bend and flex to compensate for the CTE mismatch, as described above.

This face-down structure may also make use of both the fan-in and the fan-out structure in which the terminals lie on the substrate both inside and outside the periphery of the chip in a substantially co-planar arrangement. In this configuration, the bond pads reside between the inner and outer terminals. Typically, a first gap lies between the bond pads and the inner terminals and a second gap lies between the bond pads and the outer terminals. Leads connect the inner and outer terminals to respective bond pads over respective inner and outer gaps.

The package may also be arranged in a "face-up" arrangement in which the first surface of the substrate overlies the back surface of the chip. Typically in such an arrangement conductive elements, such as wirebonded wires, are bonded to respective chip contacts and bond pads and extend along side of a respective edge of the chip.

As described above in relation to the face-down arrangement, the face-up arrangement may be in a fan-in structure, a fan-out structure or a fan-in/fan-out combined structure, each having the appropriate expansion gaps and expansion sections of the leads. In the face-up embodiment, it is important to protect the chip and other exposed elements of the package, so typically the package elements on the chip side of the substrate are encapsulated. The encapsulant can be a rigid or a compliant material.

The expansion section of the leads can also be used in a package embodiment without the substrate gap such that a tip or distal end of the expansion section of each lead is bonded to a respective chip contact.

The foregoing and other objects and advantages of the present invention will be better understood from the following Detailed Description of a Preferred Embodiment, taken together with the attached Figures.

DETAILED DESCRIPTION OF A PREFERRED EMBODIMENT

The present invention makes use of a laterally curved lead within a semiconductor package in order to compensate for the CTE mismatch between a semiconductor chip and a supporting substrate, such as a PWB.

Figure 1A:
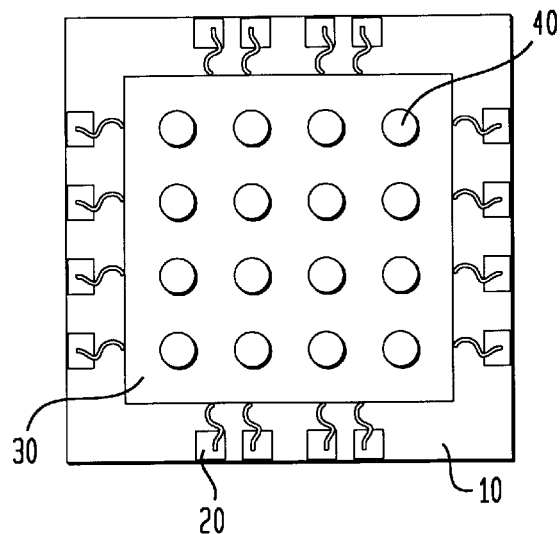
FIG. 1A shows a bottom view of a face-down, fan-in package employing an expansion lead, according to the present invention.
Figure 1B:
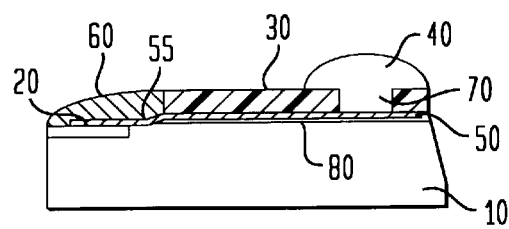
FIG. 1B shows a fragmentary cross-sectional view of a face-down, fan-in package employing an expansion lead, according to the present invention.

FIGS. 1A and 1B show a face view and a fragmentary cross-sectional view, respectively, of a chip 10 having a plurality of chip contacts 20 on a contact bearing surface. A sheet-like dielectric chip carrier substrate 30 overlies and is typically centrally located on the contact bearing surface of the chip 10 so that the chip contacts 20 are exposed. The substrate 30 may merely overly the contact bearing surface of the chip 10; however, typically, the substrate is adhesively attached to the chip surface using a thin layer of adhesive material 80, as shown in FIG. 1B. The substrate 30 may be comprised of a rigid or flexible material. Preferably, the substrate is comprised of a sheet of polyimide having a thickness approximately between 25 and 100 microns. The a first surface of the substrate 30 has a plurality of conductive terminals 40 thereon. Each of the terminals 40 is electrically connected to a chip contact 20 through conductive leads 50 extending along the opposite side of the substrate and connected to the leads 50 through conductive vias 70. Alternately, the substrate could simply be removed so that solder ball terminals could be placed directly onto the ends of the leads 50 without the need of the conductive vias 70. Each lead 50 has an expansion section 55 extending from an edge of the substrate 30. The expansion sections are each bonded to a chip contact 20, typically using conventional ultrasonic or thermosonic bonding apparatus. Each expansion section 55 is laterally curved substantially parallel to the plane of the substrate 30 prior to the bonding operation. Preferably, the expansion sections 55 laterally curve at least twice in opposite directions (substantially "s" shaped) and may be curved more than twice. The leads 50 may further be detachably connected to a supporting structure prior to bonding as disclosed and claimed in commonly assigned U.S. Pat. Nos. 5,489,749 and 5,536,909, hereby incorporated herein by reference. Typically, the expansion sections 55 of the leads are encapsulated by a suitable encapsulant, such as silicone or epoxy, to protect them from contamination and damage. During operation of the packaged chip, the terminals are attached to a PWB and the laterally curved shape of the expansion sections 55 of the leads 50 helps to compensate for the expansion and contraction of the chip during thermal cycling by having the ability to independently flex and bend. The aforementioned encapsulant 60 supports the expansion sections 55 of the leads 50 as they flex and bend and further helps to spread the forces acting on the leads. Further, a solder mask or coverlay may be placed over the exposed surface of the substrate 30 after the bonding and encapsulation steps such that only the terminals are exposed. The solder mask/coverlay is especially important in the embodiment shown in FIG. 1C because the leads 50 and the terminals 40 are on the same side of the substrate 30. The solder mask/coverlay provides a dielectric coating ensuring that the solder connecting the terminals to contacts on the PWB does not wick down the leads or short to other soldered terminals.

Figure 1C:
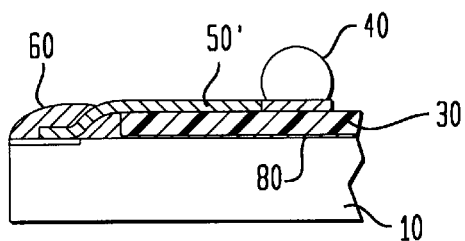
FIG. 1C shows a fragmentary cross-sectional view of a face-down, fan-in package employing an expansion lead having the leads on the second surface of the substrate, according to the present invention.

FIG. 1C shows a fragmentary cross-sectional view of an alternate embodiment in which the leads 50' are located on the same side as the terminals 40; thus, not requiring the conductive vias 70 (shown in FIG. 1B).

Figure 1D:
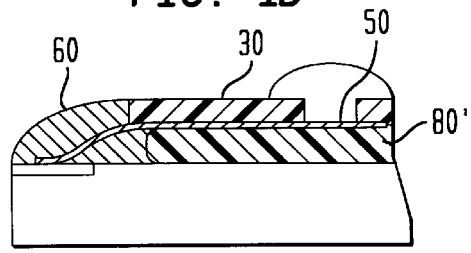
FIG. 1D shows a fragmentary cross-sectional view of a face-down, fan-in package employing an expansion lead wherein a compliant layer is disposed between the face surface of the chip and the first surface of the substrate, according to the present invention.

FIG. 1D shows a fragmentary cross-sectional view of an alternate embodiment in which the thin layer of adhesive from FIG. 1B has been replaced with a thicker layer of compliant material 80' to give added compensation for thermal mismatch, as disclosed in commonly assigned U.S. Pat. Nos. 5,148,265 and 5,148,266, hereby incorporated by reference herein. The compliant material 80' is typically about 50 to 200 microns thick and is comprised of either a thermoset or a thermoplastic material. The structure shown in FIG. 1D also allows the expansion sections 55 of the leads 50 to be shaped by the bonding operation so that they are curved in a direction perpendicular to the lateral curve of the leads 50. As stated above, these laterally and vertically curved leads are typically supported by the encapsulant 60 so as to spread the forces acting upon them during thermal cycling of the operational package.

Figure 2A:
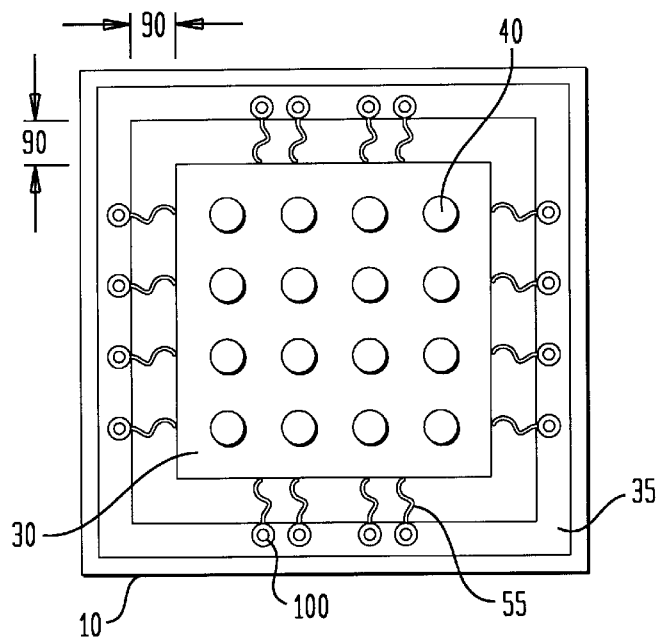
FIG. 2A shows a bottom view of a face-down, fan-in package employing an expansion/contraction gap, according to the present invention.
Figure 2B:
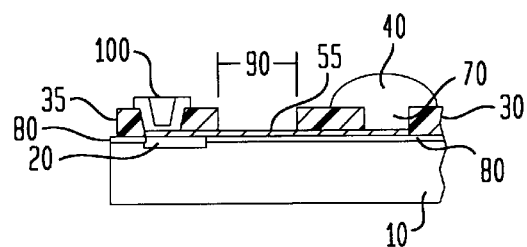
FIG. 2B shows a fragmentary cross-sectional view of a face-down, fan-in package employing an expansion/contraction gap, according to the present invention.

FIGS. 2A and 2B show a similar embodiment to that show in FIGS. 1A and 1B except that the laterally curved leads extend between the terminal bearing central substrate 30 and an outer substrate 35 thereby creating an expansion/contraction gap 90 between the two substrates such that the expansion sections 55 may independently flex and bend during operational thermal cycling of the resulting device. The outer substrate 35 is typically comprised of the same material as the central substrate 30; however, it may also be comprised of a different flexible or rigid material having the same or a different thickness when compared to the central substrate 30. In the embodiment show in FIGS. 2A and 2B, the outer substrate 35 encircles the central substrate. The outer substrate 35 further has the distal portions of the expansion sections 55 of the leads 50 connected to a coupling via 100. The coupling via 100 allows a bonder tool to transfer the bonding energy from a bonding tool to the lead/chip contact site to thereby bond each lead to a chip contact. As described above, an encapsulant 60 is typically deposited around each of the expansion sections 55 of the leads 50. Further, a solder mask or coverlay may be placed over the exposed surface of the substrate 30 after the bonding and encapsulation steps such that only the terminals are exposed.

Figure 2C:
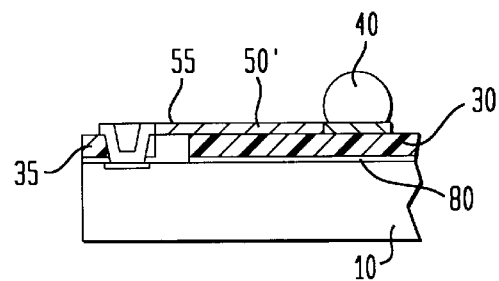
FIG. 2C shows a fragmentary cross-sectional view of a face-down, fan-in package employing an expansion/contraction gap having leads on the second surface of the substrate, according to the present invention.

FIG. 2C shows a fragmentary cross-sectional view of an alternate embodiment to FIG. 2B in which the leads 50' are located on the same side as the terminals 40; thus, not requiring the conductive vias 70 (shown in FIG. 2B).

Figure 2D:
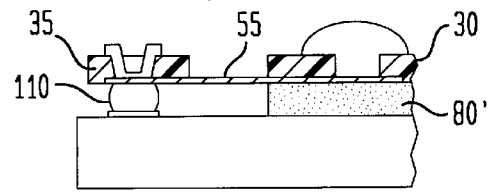
FIG. 2D shows a fragmentary cross-sectional view of a face-down, fan-in package employing an expansion/contraction gap wherein a compliant layer is disposed between the face surface of the chip and the first surface of the substrate, according to the present invention.

FIG. 2D shows a fragmentary cross-sectional view of an alternate embodiment in which the thin layer of adhesive from FIG. 2B has been replaced with a thicker layer of compliant material 80', as disclosed in connection with FIG. 1D above. The expansion sections 55 of the leads 50 may be shaped by the bonding operation so that they are curved in a direction perpendicular to the lateral curve of the leads 50, as described above, or a conductive spacer material 110 may be used such that the expansion sections remain substantially in a single plane, such as is shown in FIG. 2D. Possible examples of suitable conductive spacing materials include non-collapsing solder balls (solid core), conductive epoxy adhesives, other conductive thermoset materials and also conductive thermoplastic materials.

Figure 2E:
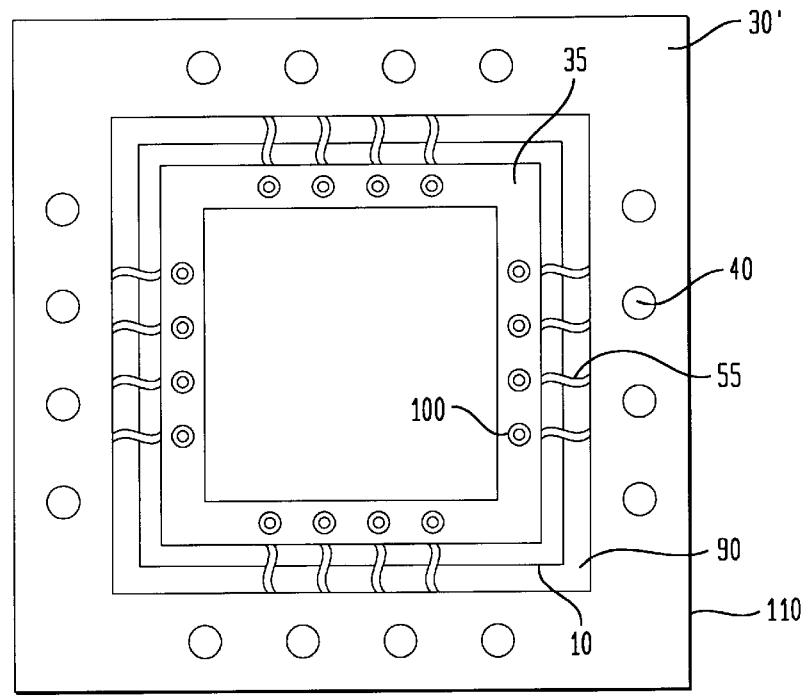
FIG. 2E shows a bottom view of a face-down, fan-out package employing an expansion/contraction gap, according to the present invention.

FIGS. 2A through 2D show so called "fan-in" embodiments where the leads extend inward from the chip contacts 20 so that package is typically no larger than the contact bearing surface of the chip 10 itself. FIG. 2E shows an alternate so called "fan-out" embodiment in which the expansion sections of the leads extend across an expansion/ contraction gap 90 which is typically positioned outside the periphery of the chip 10 itself. The terminals are then typically located on an outermost substrate 110 which encircles the substrate 35. The leads 50 electrically connect each terminal 40 to a chip contact 20 such that the curved portions within the expansion/contraction gap 90 may compensate for the CTE mismatch during operation of the finished package. Since the terminals 40 in this embodiment lie outside of the periphery of the chip 10, they may be supported by a conventional ring or flanged heat sink. Alternately, the outer edges of the substrate may be held by a substantially rigid bracket element such that the substrate is held taut.

Figure 2F:
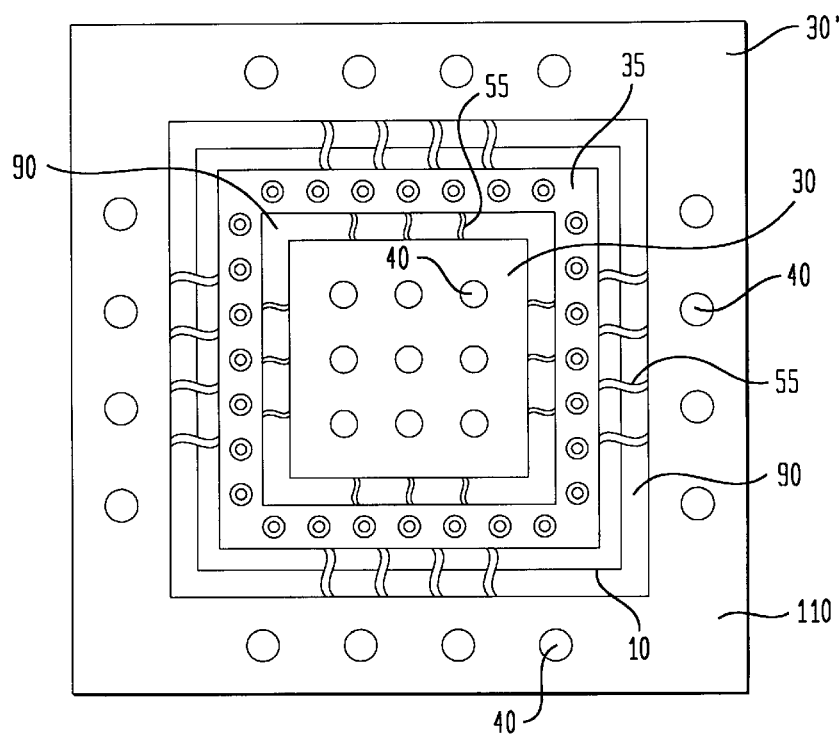
FIG. 2F shows a bottom view of a face-down, fan-in/fan-out package employing an expansion/contraction gap, according to the present invention.

FIG. 2F shows an alternate so called "fan-in and fan-out" embodiment which combines the fan-in embodiments of FIG. 2A and 2B and the fan-out embodiment of FIG. 2E. FIG. 2F has an expansion/contraction gap 90 on either side of substrate 35 thereby allowing the expansion sections 55 of the leads 50 to extend across each respective gap 90. In this way, the leads extending inwardly to the terminals overlying the contact bearing surface of the chip 10 may compensate for the CTE mismatch during operation of the finished package. Further, the expansion sections 55 of the leads 50 extending into the outer expansion/contraction gap 90 to the terminals on the substrate beyond the periphery of the chip may also compensate for the CTE mismatch during operation of the finished package.

Figure 2G:
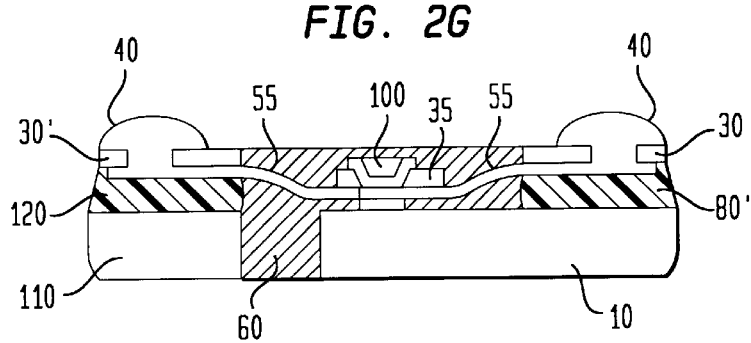
FIG. 2G shows a fragmentary cross-sectional view of the face-down, fan-in/fan-out package described in FIG. 2F combined with the compliant layer described in FIG. 2D, according to the present invention.

FIG. 2G shows a fragmentary cross-sectional view of the fan-in/out embodiment described in FIG. 2F combined with the compliant layer described in FIG. 2D. The coupling vias 100 are downwardly displaced between the central complaint material 80' and the peripheral compliant material 120 by the bonder tool. The structure shown in FIG. 2G also allows the expansion sections 55 of the leads 50 to be shaped by the bonding operation so that they are curved in a direction perpendicular to the lateral curve of the leads 50. As stated above, these laterally and vertically curved leads are typically supported by the encapsulant 60 so as to spread the forces acting upon them during thermal cycling of the operational package. This configuration also allows the leads to be gang bonded since all of the leads are connected to substrate 35 thereby allowing a gang bonding machine to simultaneously register a bonding tool to each coupling via (or the like) and bond each lead to a corresponding chip contact.

Figure 3A:
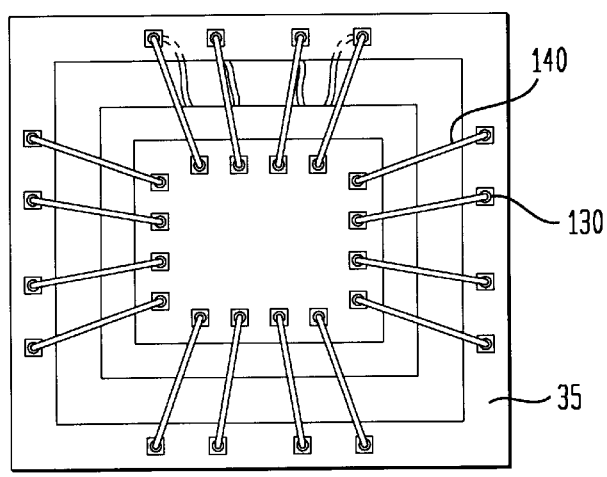
FIG. 3A shows a top view of a face-up, fan-in package employing an expansion/contraction gap, according to the present invention.
Figure 3B:
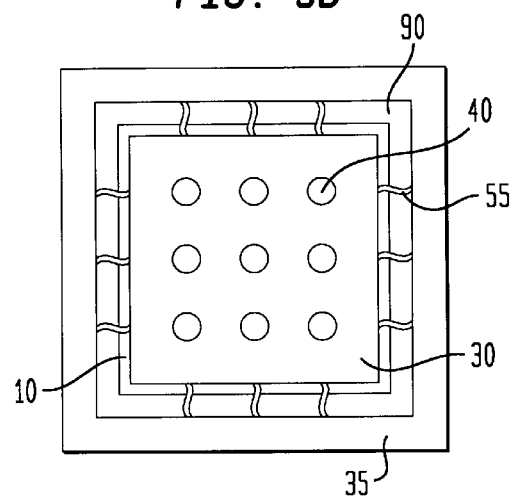
FIG. 3B shows a bottom view of a face-up, fan-in package employing an expansion/contraction gap, according to the present invention.
Figure 3C:
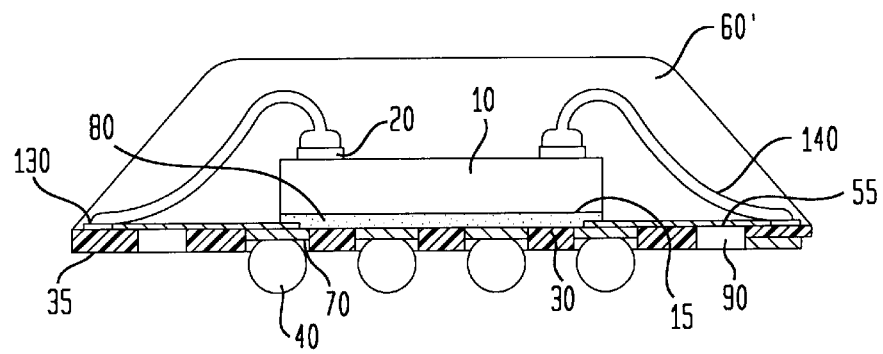
FIG. 3C shows a side cross-sectional view of an alternate face-up, fan-in package employing an expansion/contraction gap wherein the leads are located on the first surface of the substrate, according to the present invention.

FIGS. 3A through 3C show various views (top view, bottom view and cross-sectional view respectively) of a face up embodiment of the present invention. In this embodiment, a back surface 15 of the chip 10 is adhered to a central dielectric sheet-like substrate 30, typically comprised of polyimide or the like as described above, so that the chip contacts 20 face away from the substrate 30. Terminals 40 lie beneath the periphery of the back surface 15 of the chip 10. Conductive leads 50 extend from each terminal to an edge of the substrate 30. In this embodiment, the leads 50 extend on a side of the substrate 30 opposite the back surface 15 of the chip 10, but the leads 50 do not short against the chip 10 because of the dielectric adhesive therebetween. Each of the terminals 40 is electrically connected to a chip contact 20 through conductive leads 50 extending along the opposite side of the substrate and connected to the leads 50 through conductive vias 70. Alternately, the substrate could simply be removed so that solder ball terminals could be placed directly onto the ends of the leads 50 without the need of the conductive vias 70. Expansion sections 55 of the leads 50 extend beyond the periphery of the substrate 30 across an expansion/contraction gap 90 and terminate at their distal ends on a bonding pad 130 on an outer substrate 35 which substantially encircles the central substrate 30. A conventional wire bonding operation is then employed to ball or wedge bond a conductive wire 140 between each chip contact 20 and each bonding pad 130. Further, a solder mask or coverlay may be placed over the exposed surfaces of the substrates 30/35 after the bonding step such that only the terminals are exposed. The assembly is then overmolded to encapsulate the chip 10, the wires 140 and the expansion sections of the leads 55. Typically, a complaint or semi-compliant encapsulant 60' is used, such as silicone resins or flexiblizied epoxy resins. The solder mask/coverlay ensures that no encapsulant contaminates the terminals on the opposite side of the substrate 30. As described in the previous embodiments, the expansion sections 55 of the leads 50 within the expansion/contraction gap 90 help to compensate for the CTE mismatch by flexing and bending during operation of the finished package.

Figure 3D:
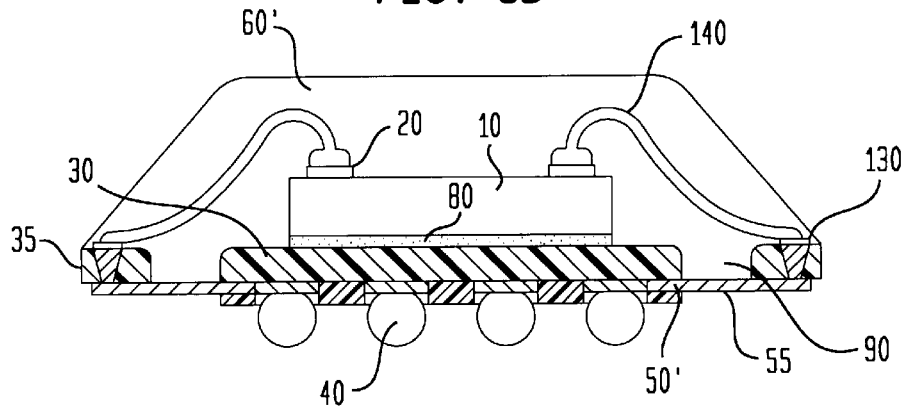
FIG. 3D shows a side cross-sectional view of an alternate face-up, fan-in package employing an expansion/contraction gap wherein the leads are located on the second surface of the substrate and covered by a solder mask, according to the present invention.

FIG. 3D shows a fragmentary cross-sectional view of an alternate embodiment to FIG. 3B in which the leads 50' are located on the same side as the terminals 40; thus, not requiring the conductive vias 70 (shown in FIG. 3C); however, such vias are required to extend from the bond pads 130 to the leads on the outer substrate 35. In this embodiment, the solder mask/coverlay is typically adhered only on the central substrate 30 so that it does not interfere with the flexing or bending of the expansion sections 55'. This embodiment further allows a more rigid encapsulant 60' to be used if desired because the encapsulant 60' is not necessarily deposited around the expansion sections 55'.

Figure 3E:
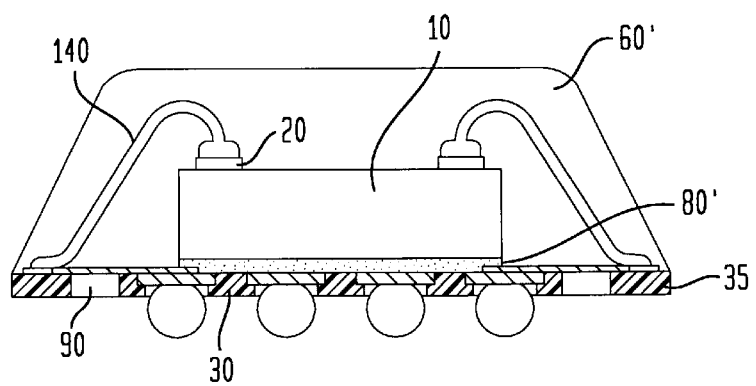
FIG. 3E shows a side cross-sectional view of an alternate face-up, fan-in package employing an expansion/contraction gap wherein a compliant layer is disposed between the back surface of the chip and the first surface of the substrate, according to the present invention.

FIG. 3E shows a fragmentary cross-sectional view of an alternate embodiment in which the thin layer of adhesive 80 from FIG. 3C has been replaced with a thicker layer of compliant material 80' to give added compensation for thermal mismatch, as disclosed above.

Figure 3F:
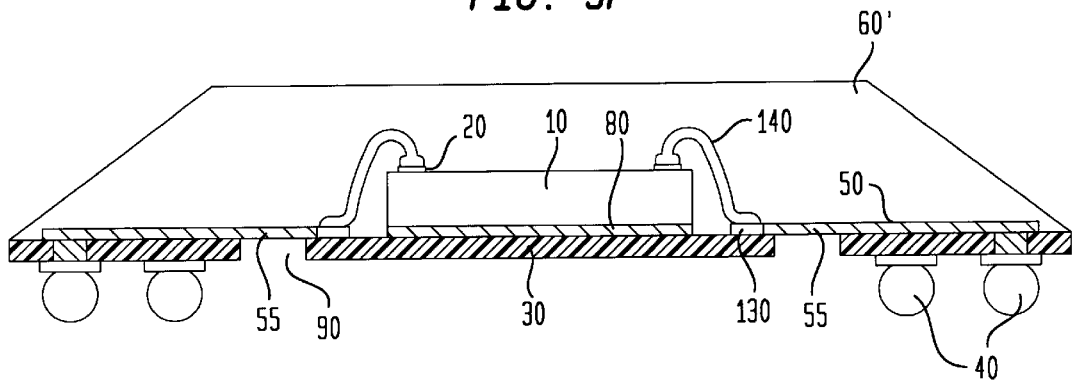
FIG. 3F shows a side cross-sectional view of an alternate face-up, fan-out package employing an expansion/contraction gap, according to the present invention.

FIG. 3F shows a fragmentary cross-sectional view of an alternate fan-out, face up embodiment in which the expansion sections of the leads extend across an expansion/contraction gap 90 which is typically positioned outside the periphery of the chip 10 itself. The terminals are typically located on an outermost substrate 110 which encircles the substrate 35. The leads 50 electrically connect each terminal 40 to a chip contact 20 such that the curved portions within the expansion/contraction gap 90 may compensate for the CTE mismatch during operation of the finished package. Since the terminals 40 in this embodiment lie outside of the periphery of the chip 10, they may be supported by the overmolded encapsulant described above. Alternately, the outer edges of the substrate may be held by a substantially rigid bracket element such that the substrate is held taut.

Figure 3G:
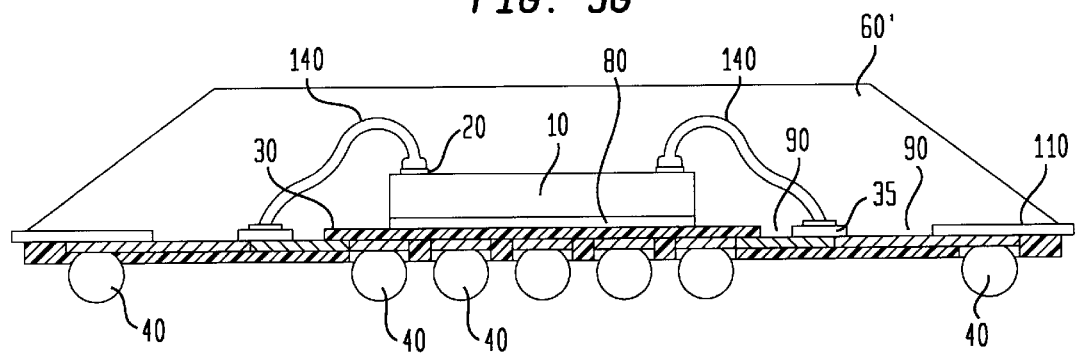
FIG. 3G shows a side cross-sectional view of an alternate face-up, fan-in/fan-out package employing an expansion/contraction gap on either side of the bond pad substrate, according to the present invention.

FIG. 3G combines the fan-in embodiments of FIG. 3A through 3C and the fan-out embodiment of FIG. 3F. FIG. 3G has an expansion/contraction gap 90 on either side of substrate 35 thereby allowing the expansion sections 55 of the leads 50 to extend across each respective gap 90. In this way, the leads extending inwardly to the terminals overlying the contact bearing surface of the chip 10 may compensate for the CTE mismatch during operation of the finished package. Further, the expansion sections 55 of the leads 50 extending into the outer expansion/contraction gap 90 to the terminals on the substrate beyond the periphery of the chip may also compensate for the CTE mismatch during operation of the finished package. Since the outer terminals 40 in this embodiment lie outside of the periphery of the chip 10, they may be supported by the overmolded encapsulant described above. Alternately, the outer edges of the substrate may be held by a substantially rigid bracket element such that the substrate is held taut. Alternately, a compliant layer such as shown in FIG. 3E may be used to aid the compensation of thermal mismatch during operation of the package.

Figure 3H:
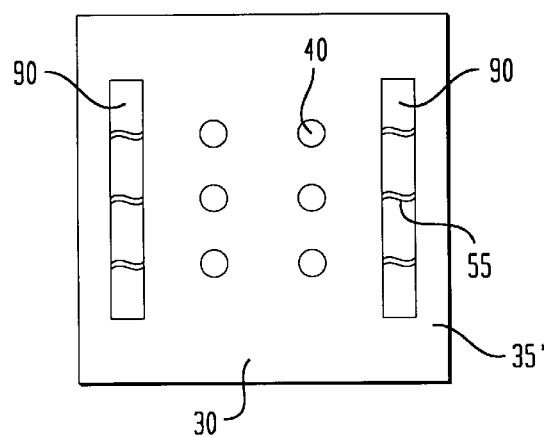
FIG. 3H shows a bottom view of an alternate face-up, fan-in embodiment of the present invention in which elongated gaps in the substrate extend parallel two of the chip edges

FIG. 3H shows a bottom view of an alternate face-up/fan-in embodiment of the present invention in which elongated gaps 90 in the substrate 30 extend parallel two of the chip edges. The package further having terminals 40 in a center region. These types of gaps 90 can also be used on all four edges of the substrate 30 and can be used in fan-out and fan-in/fan-out embodiments as well.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A semiconductor chip package, comprising:
   a substrate having a first surface and a second surface and a gap extending from said first surface said second surface, said substrate defining a plane which is substantially parallel to said first and second surfaces, the substrate further having conductive terminals accessible at the second surface and bond pads;
   conductive leads extending across the gap, each said lead electrically interconnecting one of said terminals and one of said bond pads, wherein each said lead has an expansion section within the gap which is laterally curved with respect to the plane; and
   a semiconductor chip having a back surface and a face surface, the face surface bearing a plurality of chip contacts on a periphery of the face surface of the chip, wherein the chip contacts are electrically connected to said bond pads on the substrate.

2. The semiconductor chip package claimed in claim 1, wherein the first surface of the substrate overlies the face surface of the chip.

3. The semiconductor chip package claimed in claim 1, wherein the substrate is adhered to the face surface of the chip.

4. The semiconductor chip package claimed in claim 1, wherein the bond pads lie in a central region of the substrate and are aligned and bonded to respective chip contacts, wherein the terminals lie on an outer region of the substrate.

5. The semiconductor chip package claimed in claim 1, wherein the first surface of the substrate overlies the back surface of the chip, the package further including a plurality of conductive elements extending along side of at least one edge of the chip electrically connecting each bond pad to a respective chip contact.

6. The semiconductor chip package claimed in claim 1, wherein the first surface of the substrate overlies the back surface of the chip, the package further including a plurality of conductive elements extending along side of at least one edge of the chip electrically connecting each bond pad to a respective chip contact, wherein the bond pads lie in a central region of the substrate bounded by the terminals.

7. The semiconductor chip package claimed in claim 2, said substrate further comprising:
   a central portion bearing said conductive terminals, said central portion being bounded by the chip contacts and each said bond pad being aligned with and bonded to one of said chip contacts.

8. The semiconductor chip package claimed in claim 3, wherein the substrate is compliantly adhered to the face surface of the chip.

9. The semiconductor chip package claimed in claim 4, wherein the gap in the substrate extends between the bond pads and the terminals such that the gap encircles the central region of the substrate such that there is a first substrate bearing the terminals and a second substrate bearing the bond pads.

10. The semiconductor chip package as claimed in claim 4, wherein each gap is elongated and extends parallel to an adjacent chip edge such that a plurality of expansion sections extend across a single gap.

11. The semiconductor chip package claimed in claim 5, wherein the terminals lie within a central region of the substrate bounded by the bond pads.

12. The semiconductor chip package claimed in claim 5, wherein the substrate is adhered to the face surface of the chip.

13. The semiconductor chip package claimed in claim 5, further comprising an encapsulant deposited over all of the claimed elements on the chip side of the substrate.

14. The semiconductor chip package claimed in claim 7, wherein the gap in the substrate extends between the bond pads and the terminals such that the gap encircles the central region of the substrate such that there is a first substrate bearing the terminals and a second substrate bearing the bond pads.

15. The semiconductor chip package as claimed in claim 7, wherein each substrate gap is elongated and extends parallel to an adjacent chip edge such that a plurality of expansion sections extend across a single gap.

16. The semiconductor chip package claimed in claim 8, wherein the expansion sections of the leads are displaced in a vertical direction perpendicular to the plane of the first substrate.

17. The semiconductor chip package as claimed in claim 9, wherein the second substrate has an aperture bounded by the bond pads.

18. The semiconductor chip package claimed in claim 11, wherein the gap in the substrate extends between the bond pads and the terminals such that the gap encircles the central region of the substrate such that there is a first substrate bearing the terminals and a second substrate bearing the bond pads.

19. The semiconductor chip package as claimed in claim 11, wherein each substrate gap is elongated and extends parallel to an adjacent chip edge such that a plurality of expansion sections extend across a single gap.

20. The semiconductor chip package claimed in claim 12, wherein the substrate is compliantly adhered to the face surface of the chip.

21. The semiconductor chip package claimed in claim 13, wherein the encapsulant is comprised of a compliant material.

22. The semiconductor chip package claimed in claim 14, further comprising a third outer sheet-like substrate having an aperture therein, the third substrate being substantially co-planar with respect to the first substrate, wherein the chip is positioned within the aperture such that there is an outer gap between the second substrate and the third substrate, the third substrate having conductive outer terminals on a second surface facing co-directionally with the terminals on the first substrate and outer leads extending across the outer gap and electrically connecting the outer terminals to respective bond pads on the second substrate, wherein each outer lead has an expansion section within the outer gap which is laterally curved with respect to the plane of the third substrate.

23. The semiconductor chip package claimed in claim 18, further comprising a third outer sheet-like substrate having an aperture therein, the third substrate being substantially co-planar with respect to the first substrate, wherein the chip is positioned within the aperture such that there is an outer gap between the second substrate and the third substrate, the third substrate having conductive outer terminals on a second surface facing co-directionally with the terminals on the first substrate and outer leads extending across the outer gap and electrically connecting the outer terminals to respective bond pads on the second substrate, wherein each outer lead has an expansion section within the outer gap which is laterally curved with respect to the plane of the third substrate.

24. The semiconductor chip package claimed in claim 20, wherein the expansion sections of the leads are displaced in a vertical direction perpendicular to the plane of the first substrate.

25. The semiconductor chip package claimed in claim 1 or claim 22, wherein the expansion sections laterally curve at least twice in opposite directions.

26. The semiconductor chip package claimed in claim 5 or claim 23 wherein the expansion sections laterally curve at least twice in opposite directions.

27. The semiconductor chip package claimed in claim 25, wherein the expansion sections laterally curve to create substantially "s" shaped lead portions.

28. The semiconductor chip package claimed in claim 25, further comprising a compliant encapsulant deposited over the expansion sections of the leads.

29. The semiconductor chip package claimed in claim 26, wherein the expansion sections laterally curve to create substantially "s" shaped lead portions.

30. The semiconductor chip package claimed in claim 6, wherein the gap in the substrate extends between the bond pads and the terminals such that the gap encircles the central region of the substrate such that there is a first substrate bearing the terminals and a second substrate bearing the bond pads.

31. The semiconductor chip package as claimed in claim 6, wherein each gap is elongated and extends parallel to an adjacent chip edge such that a plurality of expansion sections extend across a single gap.

32. A semiconductor chip package, comprising:
   a semiconductor chip having a back surface and a face surface, the face surface bearing a plurality of chip contacts; and
   a central substrate overlying to the face surface of the chip but not overlying the chip contacts, the substrate having conductive terminals facing away from the face surface of the chip and leads electrically connecting the terminals to the chip contacts, wherein the leads have expansion sections extending beyond the periphery of the substrate, wherein each expansion section is laterally curved with respect to the plane of the substrate, wherein each expansion section further having a distal end which is bonded to a chip contact.

33. The semiconductor chip package claimed in claim 32, wherein the substrate is adhered to the face surface of the chip.

34. The semiconductor chip package claimed in claim 32, wherein the expansion sections laterally curve at least twice in opposite directions.

35. The semiconductor chip package claimed in claim 32, further comprising a compliant encapsulant deposited over the expansion sections of the leads.

36. The semiconductor chip package claimed in claim 32, further comprising an outer substrate having an aperture therein, wherein the chip is positioned within the aperture, the outer substrate having conductive outer terminals facing co-directionally with the terminals on the central substrate and outer leads electrically connecting the outer terminals to respective chip contacts, wherein the outer leads have connections sections extending beyond the periphery of the outer substrate, wherein each expansion section of the outer leads is laterally curved with respect to the plane of the outer substrate, wherein each expansion section further having a distal end which is bonded to a chip contact.

37. The semiconductor chip package claimed in claim 33, wherein the substrate is compliantly adhered to the face surface of the chip.

38. The semiconductor chip package claimed in claim 34, wherein the expansion sections laterally curve to create substantially "s" shaped lead portions.

39. The semiconductor chip package claimed in claim 35, wherein the expansion sections of the leads are displaced in a vertical direction perpendicular to the plane of the central substrate.

* * * * *

UNITED STATES PATENT AND TRADEMARK OFFICE
CERTIFICATE OF CORRECTION

PATENT NO. : 5,821,608
DATED : October 13, 1998
INVENTOR(S) : DiStefano et al.

It is certified that error appears in the above-identified patent and that said Letters Patent is hereby corrected as shown below:

In the Abstract, line 6, delete "and" (first occurrence).

Column 2, line 9, delete "the" (second occurrence).

Column 2, line 24, delete "the" (first occurrence).

Column 3, line 7, "it desired" should read --it is desired--.

Column 3, line 21, "to outside" should read --to be outside--.

Column 3, line 26, "arrangement is" should read --arrangement, is--.

Column 3, lines 44, 45, "alongside" should read --along-side--.

Column 5, line 3, "parallel two" should read --parallel to two--.

Column 5, line 4, after edges, insert --.--.

Column 5, line 25, delete "a" (first occurrence).

Column 6, line 19, "show" should read --shown--.

Column 6, line 64, "that package" should read --that the package--.

UNITED STATES PATENT AND TRADEMARK OFFICE
CERTIFICATE OF CORRECTION

PATENT NO. : 5,821,608  
DATED : October 13, 1998  
INVENTOR(S) : DiStefano et al.

It is certified that error appears in the above-identified patent and that said Letters Patent is hereby corrected as shown below:

Column 7, line 16, "FIG." should read --FIGS.--

Column 8, line 51, "FIG." should read --FIGS.--

Column 9, line 6, "parallel two" should read --parallel to two--.

Column 9, line 7, "having" should read --has--.

Column 9, line 21, "surface said" should read --surface to said--.

Column 12, lines 28, 29, --connections-- should read --connection--.

Signed and Sealed this

Twenty-seventh Day of February, 2001

Attest:

NICHOLAS P. GODICI

Attesting Officer     Acting Director of the United States Patent and Trademark Office